United States Patent [19]

Thorsrud

[11] 4,223,382
[45] Sep. 16, 1980

[54] CLOSED LOOP ERROR CORRECT

[75] Inventor: Lee T. Thorsrud, St. Paul, Minn.

[73] Assignee: Sperry Corporation, New York, N.Y.

[21] Appl. No.: 964,993

[22] Filed: Nov. 30, 1978

[51] Int. Cl.² ............................................. G06F 11/00
[52] U.S. Cl. ........................................ 364/200; 371/3
[58] Field of Search ... 364/200 MS File, 900 MS File; 365/201; 235/302.4

[56] References Cited

U.S. PATENT DOCUMENTS 3,257,546  6/1966  McGovern ........................ 235/302.4

OTHER PUBLICATIONS

Cooper et al., "Diagnostic Error-Forcing Circuit," *IBM T.D.B.*, vol. 19, No. 5, Oct. 1976.

*Primary Examiner*—Raulfe B. Zache
*Attorney, Agent, or Firm*—John L. Rooney; Kenneth T. Grace; Marshall M. Truex

[57] ABSTRACT

Apparatus for providing a closed loop data path within a memory module to enable a central processing unit (CPU) to test the error correction circuitry of the memory module under software control without the necessity of accessing the memory arrays within the memory module. The memory module has error correction circuitry providing single bit correction/double bit detection. The error correction circuitry generates an error code which is appended to each data word upon being written into the memory array of the memory module. The error correction circuitry uses the error code to detect and correct errors in each data word read from the memory array of the memory module. A status register within the memory module stores control and status information for communication between the central processing unit and the memory module. Two bit positions of the status register are dedicated to closed loop error correct. If both bit positions contain binary zeroes, the memory module operates normally. If one of the bit positions contains a binary one, a read or write command to the memory module causes a read from or write into temporary storage of the error code within the error correction circuitry. If the other bit position contains a binary one, a read or write command to the memory module causes a read from or write into temporary storage of the memory module rather than a read into or write from the memory array of the memory module. Using the capability to read from and write into the temporary storage of the memory module, a CPU may directly test the error correction circuitry under software control without reading from and writing into the memory array of the memory module.

4 Claims, 13 Drawing Figures

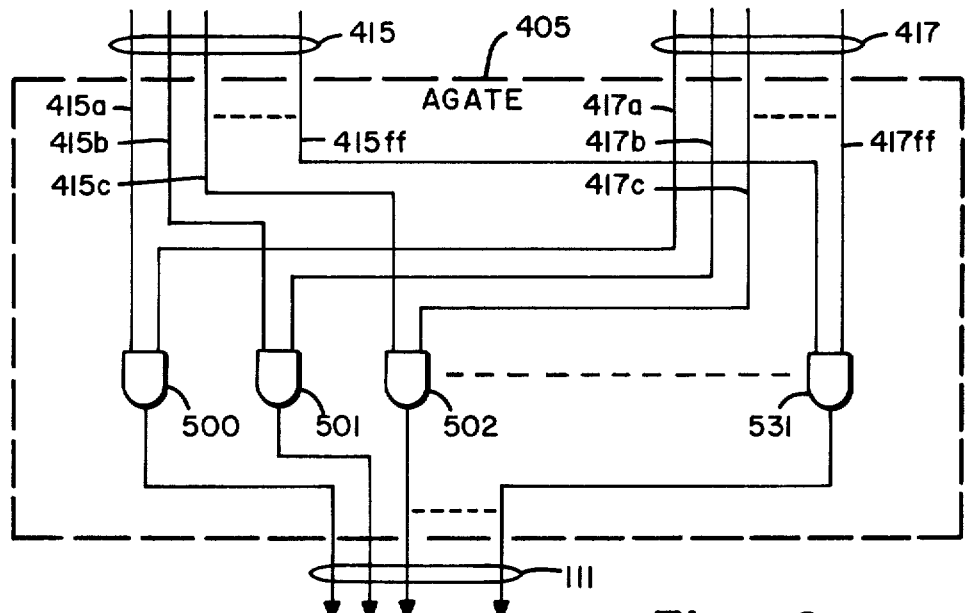
*Fig. 6*
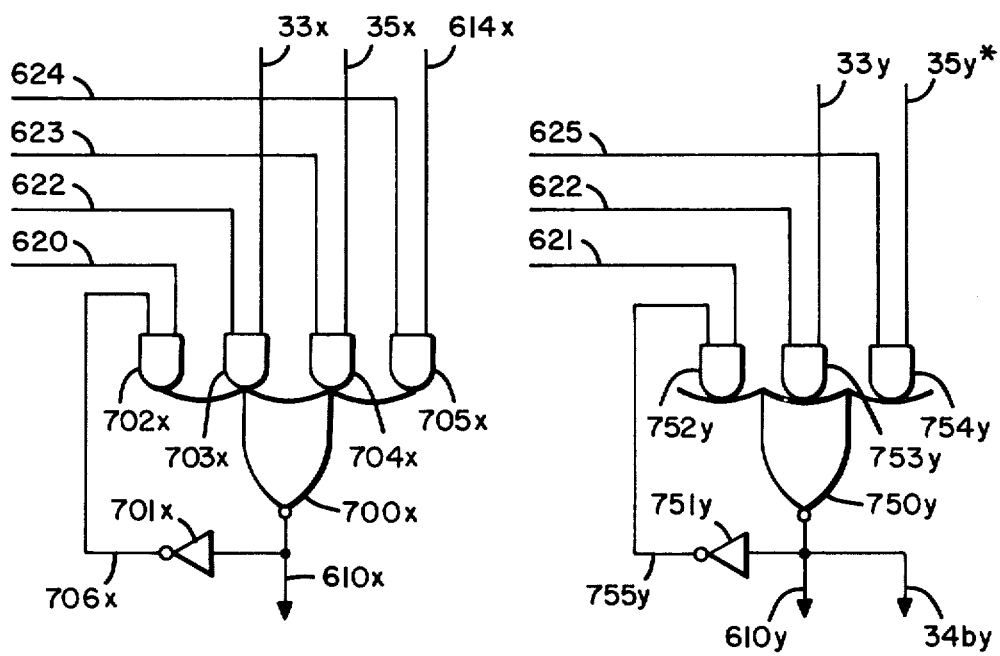
*Fig. 8a*  *Fig. 8b*

CLOSED LOOP ERROR CORRECT

BACKGROUND OF THE INVENTION

This invention relates generally to digital computer systems and more specifically to memory testing apparatus.

Many present day computers are designed to be modular in nature to provide the capability to increase or decrease the capacity of the computer by the addition or deletion of modules of the appropriate type. The memory capacity of the modular computer may be increased or decreased through the addition or deletion of one or more memory modules which normally operate asynchronously with respect to each other and with respect to other modules within the modular computer. The memory array of a memory module is the actual storage element of the memory module. Whereas memory arrays have been fabricated using many technologies in the past, semiconductor technologies currently have widespread popularity. To make semiconductor memory arrays economically feasible requires large densities. Monolithic devices of $2^{14}$, $2^{15}$ and even $2^{16}$ bit positions are now possible. Two disadavantages of such large densities on a single monolithic device are increased failure probability and increased device replacement cost. The common technique for addressing the problems is the use of error correction circuitry (ECC). The designer merely assumes the existence of errors in a memory array and designs ECC into the memory module to correct the assumed errors.

A major problem in the use of ECC is the testability of the ECC and supporting circuitry. The ECC may be effectively tested using special purpose test equipment, but this approach is usually too costly for other than the in-factory testing. A common method of field testing utilizes test software which reads and writes test patterns into the memory array and thereby inferentially tests the ECC. This technique is widely used despite the time consuming nature of the software testing. The greatest disadvantage of this technique is the necessary reliance upon assuming correct operation of the memory array. This assumption may be so unrealistic (i.e., probability of memory array failure may be so high) as to render the testing technique unacceptably unreliable. The present invention permits the cost advantages of software testing of ECC without reliance upon the use of the memory array in the testing process.

SUMMARY OF THE INVENTION

The memory module has a semiconductor memory array and contains Error Correction Circuitry (ECC). The memory module also contains a status register which is used for control of various member functions and for indicating certain status information (e.g., error status, error logging, etc.). The status register may be accessed (i.e., written into and read from) as if it were an addressable location of the memory module whenever the memory module is placed into maintenance mode. A two position manual switch selects normal or maintenance mode. In maintenance mode one or more addresses are dedicated to accessing the status register. Therefore, the contents of the status register may be altered by placing the memory module into maintenance mode and writing via software into a dedicated address.

Two bit positions of the status register are dedicated to closed loop error correct. If both bit positions are clear (i.e., contain binary zeroes), operation of the memory module is normal. One of the two bit positions is called access error code while the other is termed closed loop error. If closed loop error is set (i.e., contains a binary one), a read from the memory module does not access (i.e., does not read from) the memory array but merely returns whatever data is found in the register interfacing the memory array to the memory module. Therefore, if closed loop error is set, a write access followed by a read access returns the write data as read without accessing the memory array. If access error code is set, any read or write access directly reads from or writes into the register which stores the error code for interfacing the memory array to the memory module without accessing the memory array. It can be readily seen that software testing of ECC may be developed using closed loop error and access error code capabilities without the necessity of accessing the memory array.

BRIEF DESCRIPTION OF THE DRAWINGS

FIG. 6 provides a description of the AND gate circuitry, AGATE 405.

FIG. 8a shows one bit position of LATCH/MUX 600 at bit positions $2^0$–$2^{63}$.

FIG. 8b shows one bit position of LATCH/MUX 600 at bit positions $2^{64}$–$2^{71}$.

DETAILED DESCRIPTION OF THE PREFERRED EMBODIMENT

The memory module chosen for initial use of the present invention was designed to be a part of an AN/UYK-7(V) computer set. The AN/UYK-7(V) computer set is a standard piece of military hardware currently in the inventory of the U.S. Department of Defense. The reader is urged to familiarize himself with the AN/UYK-7(V) computer set to fully understand the disclosure contained herein. Circuit diagrams for the AN/UYK-7(V) computer set are designated NAVSEA 0967-LP-319-4030 and NAVSEA 0967-LP-319-4040. They may be obtained from the Naval Sea Systems Command in Washington, D. C. Also of interest and available from the same source are NAVSEA 0967-LP-319-4010 and NAVSEA 0967-LP-319-4020 which are the technical description and parts list, respectively, for the AN/UYK-7(V) computer set.

Figure 1:
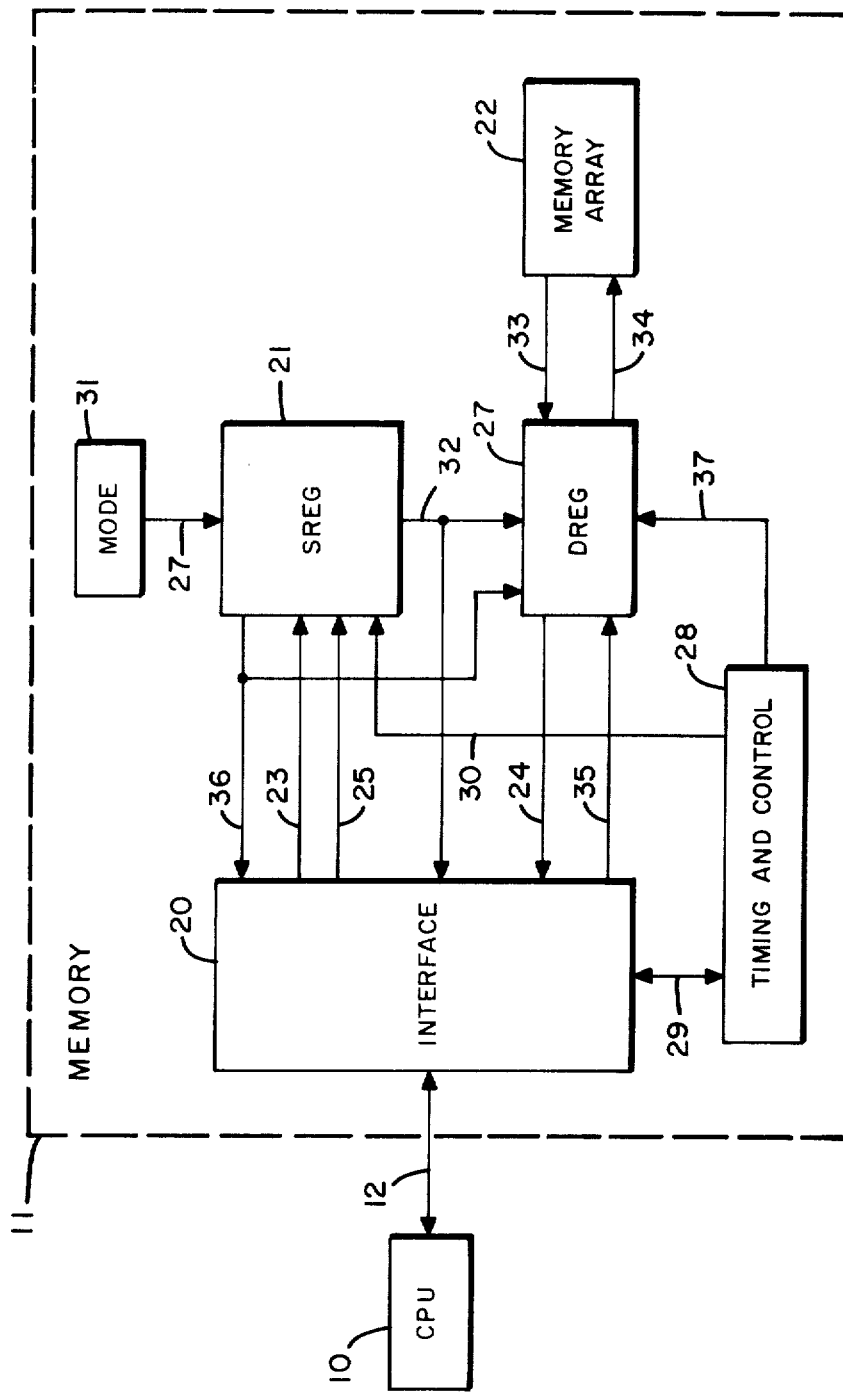
FIG. 1 shows a computer containing memory module, MEMORY 11 with its major component parts.

FIG. 1 shows the computer containing memory module, MEMORY 11, employing the present invention.

Central Processing Unit, CPU 10, is programmable through the execution of a series of software instructions as taught by the references cited above. CPU 10 is shown as interfacing to MEMORY 11 via line 12. Actually the interface to MEMORY 11 is quite complex, and the reader should refer to NAVSEA 0967-LP-319-4030 for further details. Only one requestor (i.e., CPU 10) is shown although MEMORY 11 may have up to eight requesters as it has eight requester ports. (See NAVSEA 0967-LP-319-4030).)

Interface circuitry, INTERFACE 20, interfaces directly with CPU 10 via line 12 and handles the protocol for MEMORY 11. MEMORY ARRAY 22 is a semiconductor random access store constructed using $2^{14}$ bit monolithic devices such as Motorola MCM4116, MOSTEK MK4116, or National Semiconductor MM5290. MEMORY ARRAY 22 is configured as a $2^{15}$–$2^{17}$ word by 72 bit store. The AN/UYK-7(V) computer set uses a basic 32 bit word without parity, although CPU 10 may also read into or write from MEMORY 11 using an eight bit byte or 16 bit half word (see NAVSEA 0967-LP-319-4030). Therefore, each 72 bit word of MEMORY ARRAY 22 provides two 32 bit data words and an eight bit error code. Each access (i.e., read from or write into) causes the access of a full 72 bit word from MEMORY ARRAY 22. Therefore, line 33 and line 34 which transfer read and write data between MEMORY ARRAY 22 and the data register, DREG 27, transfer a full 72 bits with each access. DREG 27 provides the routing of the desired portion of the 72 bit word and error correction functions as well as the buffering of data during the read or write operation. For example, each read from MEMORY 11 causes MEMORY ARRAY 22 to fetch a full 72 bit word and transfer it to DREG 27 via line 33. DREG 27 error corrects the 64 bit data word using the eight bit error code as necessary and transfers the desired 32 bit data requested to INTERFACE 20 via line 24. Similarly, during a write access DREG 27 receives an 8, 16 or 32 bit data word from INTERFACE 20 via line 35. MEMORY ARRAY 22 reads the contents of the appropriate addressable location and transfers the full 72 bits to DREG 27. The 8, 16 or 32 bit data word received from INTERFACE 20 is inserted into the proper location of the 72 bit word just received from MEMORY ARRAY 22. A new eight bit error code is computed and the modified 72 bit word is transferred to MEMORY ARRAY 22 via line 34 for storing at the appropriate addressable location. Further details concerning DREG 27 may be found below.

The manual mode change circuitry, MODE 31, supplies mode change commands to the status register, SREG 21 via line 27. SREG 21 receives an address signal via line 25 and write data via line 23 from INTERFACE 20. SREG 21 supplies INTERFACE 20 and DREG 27 with an indication of the states of status register bit position via line 32. Line 36 indicates to INTERFACE 20 and DREG 27 whether SREG 21 is or is not being accessed under software control). TIMING AND CONTROL 28 exchanges timing signals with INTERFACE 20 via line 29 and supplies timing and control signals to SREG 21 via line 30 and to DREG 27 via line 37.

Figure 2:
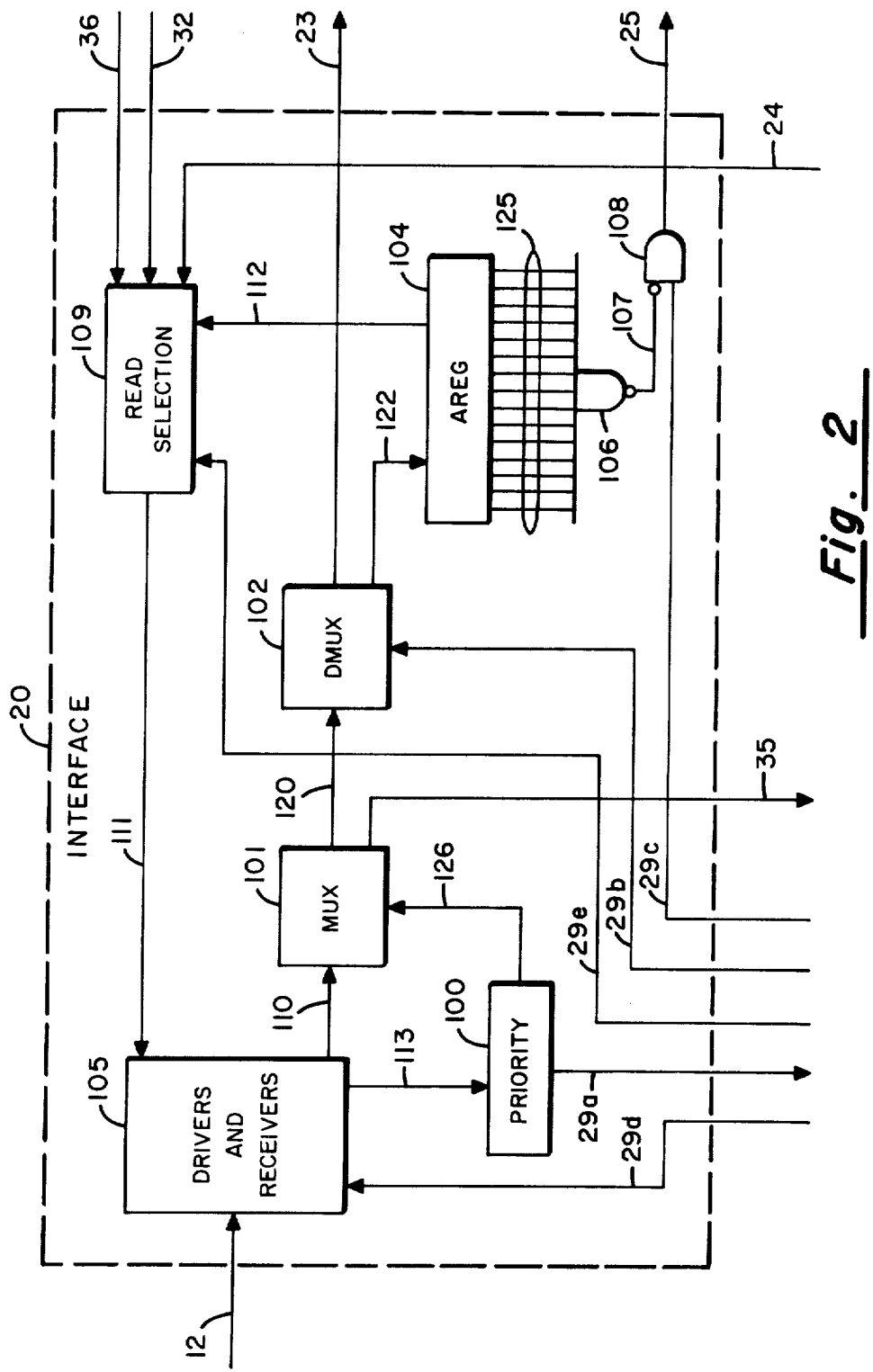
FIG. 2 shows the operation of the interface logic.

FIG. 2 provides a more detailed view of INTERFACE 20. DRIVERS AND RECEIVERS 105 receive data and control signals from CPU 10 and transfer data and control signals to CPU 10 via line 12 which is described by the cited references as the CPU operand memory bus. The cited references also supply circuit descriptions of DRIVERS AND RECEIVERS 105. The control signals received from CPU 10 are transferred via line 113 to PRIORITY 100 which determines when a request received via line 12 will be honored. The data received from CPU 10 via line 12 is transferred to multiplexer, MUX 101, via line 110. MUX 101 is necessary because MEMORY 11 may interface with up to eight requestors each with a separate interface to DRIVERS AND RECEIVERS 105 (see NAVSEA 0967-LP-319-4030).

PRIORITY 100 determines when any one of the eight requestor ports will be granted access to MEMORY 11. PRIORITY 100 notifies MUX 101 via line 126 to select data from one of the eight requestors (only one shown). PRIORITY 100 notifies TIMING AND CONTROL 28 via line 29a when an access request is to be processed. MUX 101 selects data from one of the eight requestors (only one shown with its data transferred on line 110) as specified by PRIORITY 100 via line 126 and transfers the data to the demultiplexer, DMUX 102, via line 120 and to DREG 27 via line 35. DMUX 102 routes the data to either the status register, SREG 21, via line 23, or to the address register, AREG 104, via line 122 based upon a command from TIMING AND CONTROL 28 received via line 29b.

DMUX 102 either routes an address word received from MUX 101 via line 120 to AREG 104 via line 122 or routes an 8, 16 or 32 bit data word received from MUX 101 via line 120 to SREG 21 via line 23. The selection is accomplished by DMUX 102 in response to a command from TIMING AND CONTROL 28 received via line 29b. AREG 104 is a register which holds the address word received from DMUX 102 via line 122. AREG 104 is normally used to address MEMORY ARRAY 22 via circuitry which is not shown. AREG 104 is also used in accessing SREG 21 through circuitry which is shown. AREG 104 holds the address word. In the preferred embodiment, SREG 21 is accessed as address $77777_8$ (only if MEMORY 11 is in the maintenance mode). Therefore, to select access to SREG 21 requires AREG 104 to have bit position $2^0$–$2^{14}$ (i.e., $2^0$, $2^1$, $2^2$, $2^3$, ..., $2^{14}$) contain binary ones. This provides an address of $77777_8$. (Note that the address is really $X77777_8$ where X is determined by address bits $2^{15}$–$2^{17}$ which are not used to determine access to the status register.)

The contents of the 15 bit positions (i.e., $2^0$, $2^1$, $2^2$, $2^3$, ..., $2^{14}$) are transferred via line 125 to AND gate 106. If and only if all 15 bit positions contain binary ones (i.e., AREG 104 contains an address word of $X77777_8$), AND gate 106 makes line 107 low. Line 107 is high if AREG 104 contains any other address word. AND gate 108 makes line 25 a high if and only if line 29c is high and line 107 is low. Line 29c is a timing signal received from TIMING AND CONTROL 28.

As stated above, DMUX 102 transfers an 8, 16 or 32 bit data word to SREG 21 line 23. Line 23 contains four conductors representing the contents of the four bit positions which will be transferred to SREG 21 at those bit positions important to closed loop error correct. In the preferred embodiment they are bit positions $2^{16}$, $2^{17}$, $2^{18}$ and $2^{19}$. If one of these bit positions contains a binary zero, the corresponding one of the four conductors of line 23 is at a high. If one of these bit positions contains a binary one, the corresponding one of the four conductors of line 23 is at a low.

Line 32 transfers the contents of the status register bit positions of concern (i.e., bits $2^{16}$, $2^{17}$, $2^{18}$ and $2^{19}$) to the read selection circuitry, READ SELECTION 109. Line 36 transfers an enable signal to READ SELECTION 109 which is discussed further below. READ SELECTION 109 also receives the contents of AREG 104, bit position $2^0$, via line 112. Line 24 transfers the output of DREG 27 to READ SELECTION 109 for read accesses. Line 29e provides READ SELECTION 109 with some required timing signals. DRIVERS AND RECEIVERS 105 receive an enable from TIMING AND CONTROL 28 via line 29d. READ SELECTION 109 supplies DRIVERS AND RECEIVERS 105 via line 111 with the 32 bit data word to be transferred to CPU 10 in response to a read access command.

Figure 3:
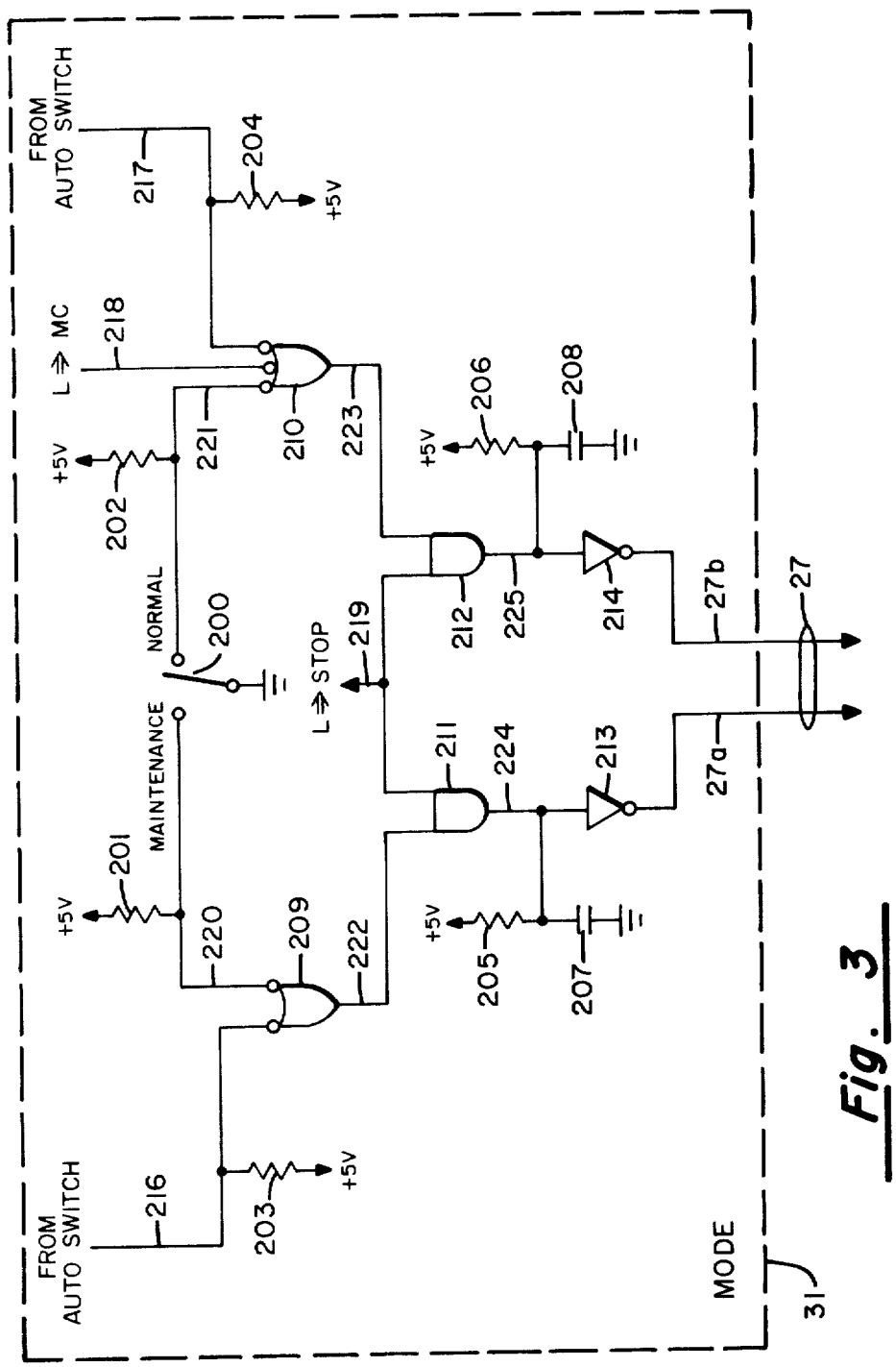
FIG. 3 describes the circuitry which provides the capability for manual mode change.

FIG. 3 is a circuit diagram of the manual mode change circuit, MODE 31. Single pole-double throw (SPDT) switch 200 is a means whereby an operator enters the mode change. SPDT switch 200 is a momentary contact switch to provide some noise immunity. The use of a momentary contact switch is permissible because a flip-flop, discussed blow, stores the actual switch position. Upon being switched to MAINTENANCE mode, SPDT switch 200 momentarily couples line 220 to ground. NOR gate 209 senses this as a low causing NOR gate 209 to make line 222 high. Assuming line 219 is also high (i.e., no stop signal is present), AND gate 211 allows line 224 to be high. Inverter 213 inverts the high and applies a low to line 27a. MAINTENANCE mode may also be entered via automatic means at line 216. This is not disclosed because it has not yet been implemented. Resistors 201, 203 and 205 are "pullup" resistors of value 1,000 ohms. They are used to source current to the various lines (i.e., line 220, line 216 and line 224, respectively) to provide desirable risetimes on transitions to high. Capacitor 207 decouples high frequency switching transients. The STOP signal prevents mode change during primary power transients.

A switch to NORMAL mode is accomplished by SPDT switch 200 being placed into the NORMAL position. The signal is propagated in similar fashion through NOR gate 210, AND gate 212 and inverter 214. Pullup resistors 202, 204 and 206 are also 1,000 ohms. A switch to NORMAL mode results in inverter 214 applying a low to line 27b.

Figure 4:
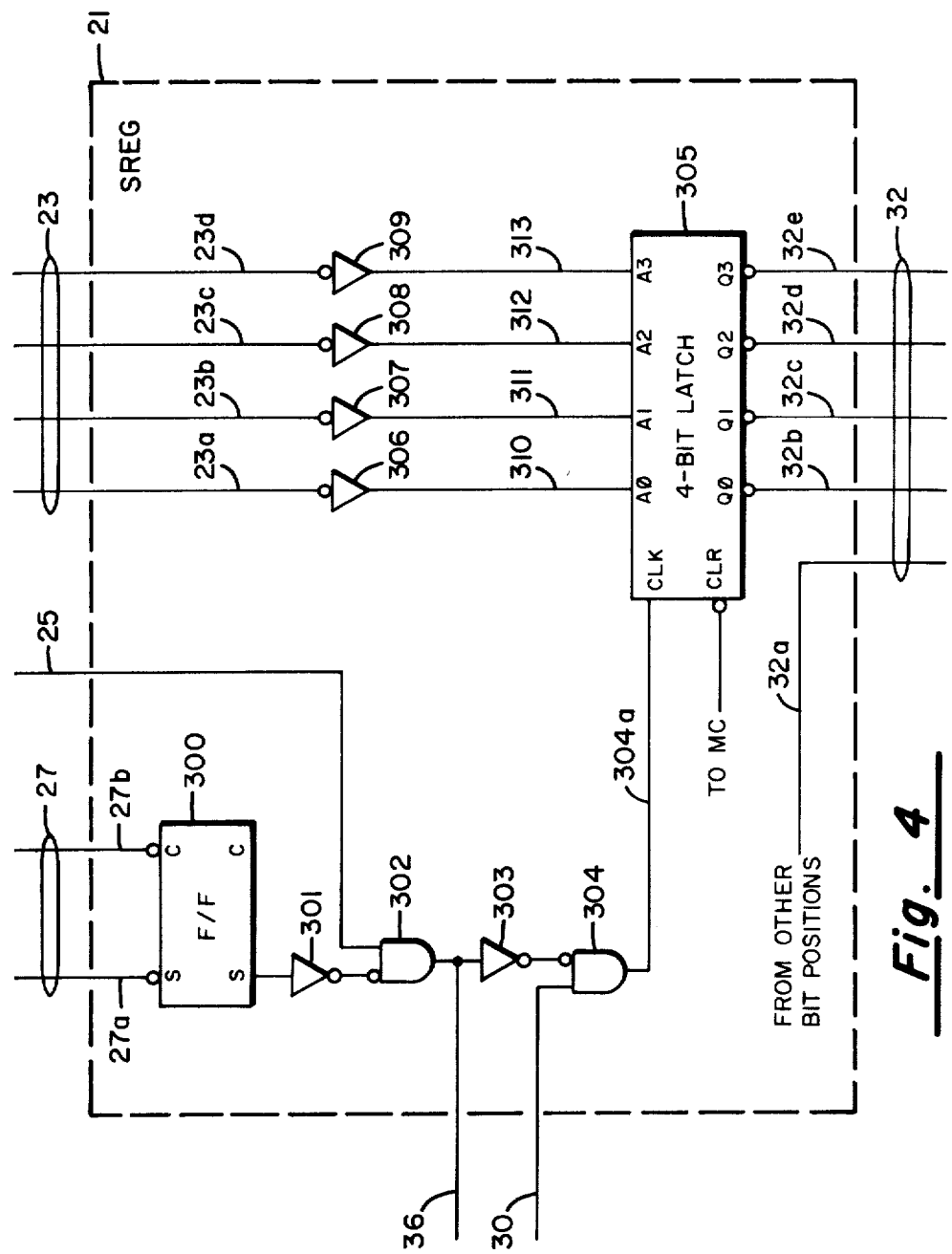
FIG. 4 shows the status register circuitry dedicated to closed loop error correct.

FIG. 4 shows the operation of status register, SREG 21. Only four bit positions (i.e., bit positions $2^{16}$, $2^{17}$, $2^{18}$ and $2^{19}$) are illustrated for clarity. The remaining bit positions of SREG 21 provide functions not relevant to the present invention. Line 27a and line 27b transfer the mode change signals (i.e., line 27a=low=>MAINTENANCE mode; line 27b=low=>NORMAL mode) received from MODE 31. Flip-flop, F/F 300, actually stores the current mode (i.e., F/F 300 set=->MAINTENANCE mode, F/F 300 clear=>NORMAL mode). If F/F 300 is set, set output, S, is high. If F/F 300 is clear, S is low. The output of F/F 300 is inverted by inverter 301 and applied to gate 302. The output of gate 302 is high if F/F 300 is set (i.e., MAINTENANCE mode), and line 25 is high (i.e., AREG 104 contains an address word of X77777$_8$ as shown on FIG. 2). The output of gate 302 is inverted by inverter 303 and applied as an input to gate 304. The output of gate 302 is also transferred to READ SELECTION 109 and DREG 27 via line 36 to indicate when SREG 21 is being accessed. When line 30 from TIMING AND CONTROL 28 goes high and the output of inverter 303 goes low (i.e., output of gate 302 is high), the output of gate 304 goes high which is transferred to the clock input, CLK, of the four bit latch, 4-BIT LATCH 305 which is a monolithic device of the type 54LS174. Each of the four conductors of line 23 (i.e., lines 23a, 23b, 23c and 23d) is high if the corresponding bit position (i.e., $2^{16}$, $2^{17}$, $2^{18}$ or $2^{19}$) transferred from DMUX 102 is a binary zero and is low if the corresponding bit position transferred from DMUX 102 is a binary one as explained above. The four INVERTERS (i.e., 306, 307, 308 and 309) invert the signals found on the four conductors of line 23 and provide the inverted signals to 4-BIT LATCH 305 via lines 310, 311, 312 and 313. For example, INVERTER 306 receives a low via line 23a if bit position $2^{16}$ transferred from DMUX 102 is a binary one and supplies a high to input A$\phi$ of 4-BIT LATCH 305. Similarly, INVERTER 307 receives a high via line 23b if bit position $2^{17}$ transferred from DMUX 102 is a binary zero and supplies a low to input A1 of 4-BIT LATCH 305.

The outputs of 4-BIT LATCH are compliments at Q$\phi$, Q1, Q2 and Q3. That is if all bit positions of 4-BIT LATCH 305 contain binary zeros, Q$\phi$, Q1, Q2 and Q3 are high. If all bit positions of 4-BIT LATCH 305 contain binary ones, Q$\phi$, Q1, Q2 and Q3 are low. The state of 4-BIT LATCH 305 is changed only when line 304a goes high. When line 304a goes high, the state of the four bit positions of 4-BIT LATCH 305 are determined by lines 310, 311, 312 and 313. For example, if line 310 is high and line 304a goes high, bit position $2^{16}$ will be caused to contain a binary one and line 32b will become low. Similarly, if line 311 is low and line 304a goes high, bit position $2^{17}$ will be caused to contain a binary zero and line 32c will become high. Lines 32b, 32c, 32d and 32e contain the compliment outputs of bit positions $2^{16}$, $2^{17}$, $2^{18}$ and $2^{19}$ of the status register respectively. See Table A. The compliment outputs of the remaining 28 bit positions (i.e., $2^0$–$2^{15}$ and $2^{20}$–$2^{31}$) of the status register are represented by line 32a. During the remaining discussion, however, only bit positions $2^{18}$ and $2^{19}$ will be discussed as relevant to the present invention.

TABLE A

| SR BIT POSITION | CONDUCTOR |
| --- | --- |
| Bit 16 | 32b |
| Bit 17 | 32c |
| Bit 18 | 32d |
| Bit 19 | 32e |

Figure 5:
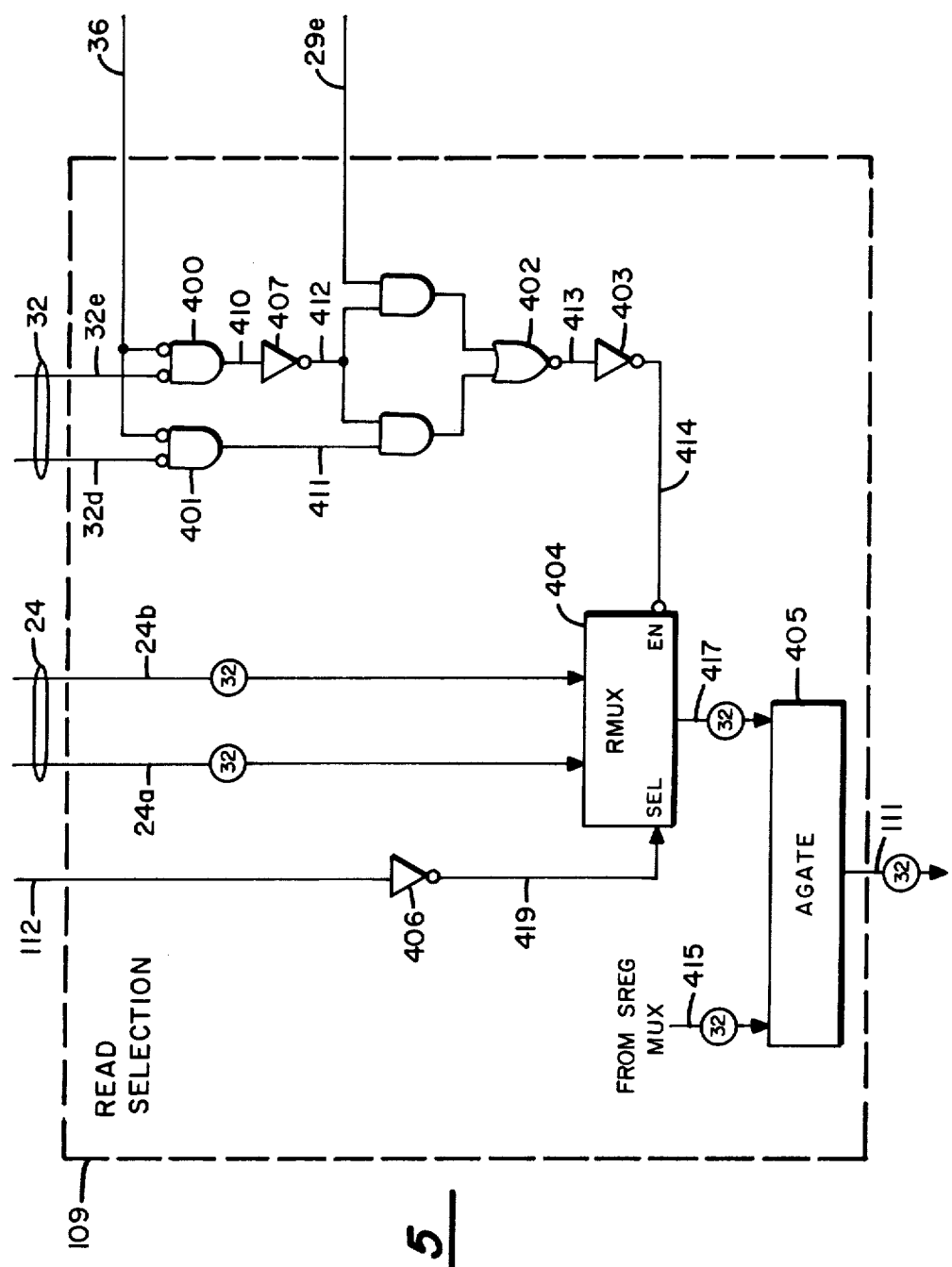
FIG. 5 illustrates the operation of the read selection circuitry, READ SELECTION 109.

FIG. 5 shows the details of READ SELECTION 109. It is the function of READ SELECTION 109 to select the desired 32 bit data word from the appropriate source and transfer it to INTERFACE 20 via line 111. AND gates, AGATE 405, combine the 32 bit data stream received from the status register multiplexer, SREG MUX (not shown), via line 415 with the 32 bit data stream received from the read multiplexer, RMUX 404 via line 417. It is really the latter which is of interest. RMUX 404 receives the 64 bit output of DREG 27 (see also FIG. 1) as two 32 bit words arriving on lines 24a and 24b. RMUX 404 selects either input for transfer via line 417 based upon the selection input, SEL, received via line 419. If line 419 is at a low state, RMUX 404 selects the data on line 24a for transfer to AGATE 405 via line 417. If line 419 is at a high state, RMUX 404 selects the data on line 24b for transfer to AGATE 405 via line 417. Inverter 406 receives the content of bit position $2^0$ of AREG 104 via line 112 (see above). If bit position $2^0$ of AREG 104 is clear (i.e., contains a binary zero), line 112 is high. Inverter 406 makes line 419 low causing RMUX 404 to select line 24a. If bit position $2^0$ of AREG 104 is set (i.e., contains a binary one), line 112 is low. Inverter 406 makes line 419 high causing RMUX 404 to select line 24b. The enable input, EN, of RMUX 404 determines whether the selected input will be transferred to AGATE 405 via line 417. If line 414 is high, for example, RMUX 404 is disabled causing RMUX 404 to make all 32 conductors of line 417 high. If line 414 is low, however, RMUX 404 is enabled causing RMUX 404 to transfer the data received on the selected line (i.e., either line 24a or 24b) to AGATE 405 via line 417. RMUX 404 is eight devices of the type 54LS158.

RMUX 404 is enabled if line 414 is low. Line 414 is made low by inverter 403 if line 413 is high. Line 413 is made high by gate 402 if line 412 is low or if both line 411 and line 29e are low. Line 29e is caused to go low by TIMING AND CONTROL 28 at the time when data from DREG 27 should be enabled to AGATE 405 if at all. As such line 29e is normally high going low only during the end of a read access cycle. Line 29e thus prevents enabling the transfer of data during the time when the data in DREG 27 is changing or not yet stabilized. Line 411 is made low by gate 401 if either line 32d or line 36 are high. Therefore, if bit position $2^{18}$ of SREG 21 is set or if SREG 21 is being accessed (see above and also FIG. 4), gate 410 make line 411 low. Line 412 is made low by inverter 407 if line 410 is high. Line 410 is made high by gate 400 if line 32e is low (i.e., bit position $2^{19}$ of SREG 21 is set) and line 36 is low (i.e., SREG 21 is not being accessed).

FIG. 6 shows the circuitry in AGATE 405. The AND gates 500–531 merge the two 32-bit data streams received from lines 415 and 417 into a single 32-bit data stream which is transferred to DRIVERS AND RECEIVERS 105 via line 111. RMUX 404 and SREG MUX (not shown) cannot both be enabled simultaneously. Therefore, all 32 conductors of either line 415 or line 417 must be all ones.

Figure 7:
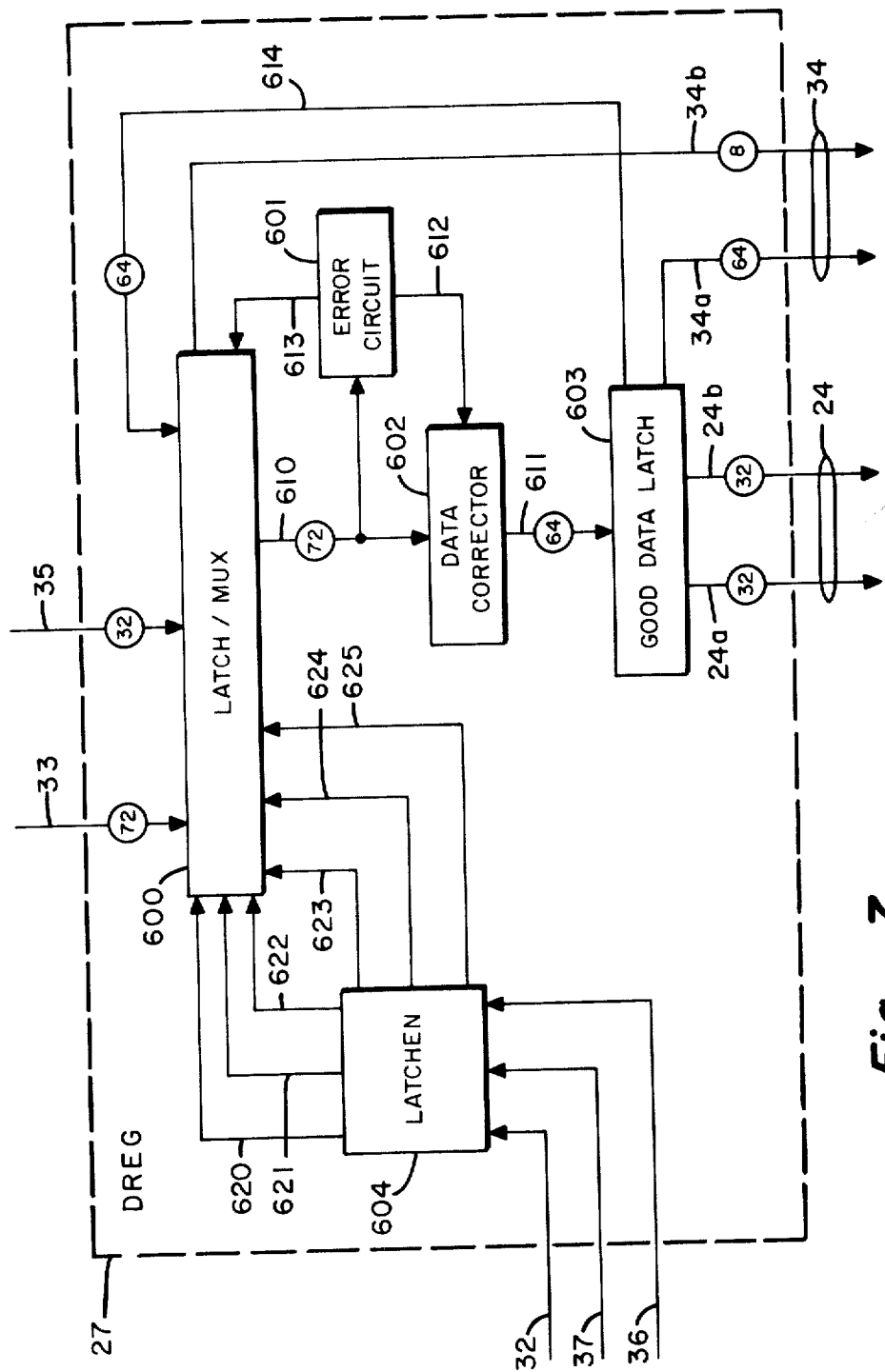
FIG. 7 gives an overall description of the memory module data register, DREG 27.

FIG. 7 shows the operation of DREG 27. The major elements of DREG 27 are the 72 bit latch/multiplexer, LATCH/MUX 600; the latch enable circuitry, LATCHEN 604; the error circuitry, ERROR CIRCUIT 601; the data corrector, DATA CORRECTOR 602; and the 64 bit latch, GOOD DATA LATCH 603. During a normal read operation, the full 72 bit word is received by LATCH/MUX 600 from MEMORY ARRAY 22 via line 33. The 72 bits are sent to DATA CORRECTOR 602 via line 610. The corrected 64 bit data word (i.e., error code is removed) is transferred to GOOD DATA LATCH via line 611 from where it is transferred to READ SELECTION 109 via lines 24a and 24b as two 32-bit data words (see also FIG. 5). During a normal write operation, the full 72-bit word is received by LATCH/MUX 600 from MEMORY ARRAY 22 via line 33. The 72-bit word is error corrected as before. The 64-bit contents of the GOOD DATA LATCH 603 are then returned to LATCH/MUX 600 via line 614. The write data is received from MUX 101 via line 35. The write data is used to alter the contents of LATCH/MUX 600 so that the write data is placed into the 64-bit data word. ERROR CIRCUIT 601 computes the new eight bit error code and supplies it to LATCH/MUX 600 via line 613. The new 72-bit word is transferred to MEMORY ARRAY 22 via line 34 and written into the appropriate addressable location. The 64 data bits are transferred from GOOD DATA LATCH 603 via line 34a, and the eight bit error code is transferred directly from LATCH/MUX 600 via line 34b. LATCHEN 604 supplies LATCH/MUX 600 with the signals controlling its operation via lines 620, 621, 622, 623, 624 and 625. LATCHEN 604 requires lines 32, 36 and 37 as inputs. Line 32 transfers the states of the bit positions of SREG 21. Line 36 is high if SREG 21 is being accessed (see above) and low at all other times. Line 37 transfers several timing signals from TIMING AND CONTROL 28. These timing signals are discussed below. ERROR CIRCUIT 601, DATA CORRECTOR 602 and GOOD DATA LATCH 603 are implemented using common schottky and low-power schottky devices and will not be explained in detail.

LATCH/MUX 600 contains 72 bit positions. FIG. 8a shows one of the 64 data bit positions (i.e. $2^0$, $2^1$, $2^2$, ..., or $2^{63}$). FIG. 8b shows one of the eight bit positions dedicated to the error code (i.e., $2^{64}$, $2^{65}$, $2^{66}$, ..., or $2^{71}$). Referring to FIG. 8a, one can see that one data bit may be input from MEMORY ARRAY 22 via line 33x (i.e., the xth bit position), from MUX 101 via line 35x, or from GOOD DATA LATCH 603 via line 614x. Line 610x is the output of the xth bit position of LATCH/MUX 600. The feedback loop comprising line 610x, inverter 710x, line 706x and gate 702x latches the bit position to a constant state. Line 620 is a clear input. If line 620 is high, the bit position will latch. If line 620 is low, the bit position will not latch (or remain latched). Line 622 if high enables the data bit on line 33x into the latch via gate 703x. A high on line 623 enables the data bit on line 35x into the latch via gate 704x. A high on line 624 enables the data bit on line 614x into the latch.

Referring to FIG. 8b, the operation of the yth bit of LATCH/MUX 600 can be seen wherein the yth bit is one of the eight error code bits. Line 33y transfers the yth bit from MEMORY ARRAY 22. Line 35y* transfers the corresponding one of the least significant eight bit positions of line 35 (i.e., $2^0$, $2^1$, $2^2$, ..., or $2^7$) received from MUX 101. This means that bit positions $2^0$–$2^7$ of line 35 not only are connected to the corresponding data bit positions of LATCH/MUX 600 (see FIG. 8a, but are also connected to the eight error code bit positions as in FIG. 8b. The latch, clear and enable functions are identical to that shown in FIG. 8a except that no input is required from GOOD DATA LATCH 603 (i.e., line 614). The output of gate 750y is transferred via line 34by as well as line 610y.

Figure 9:
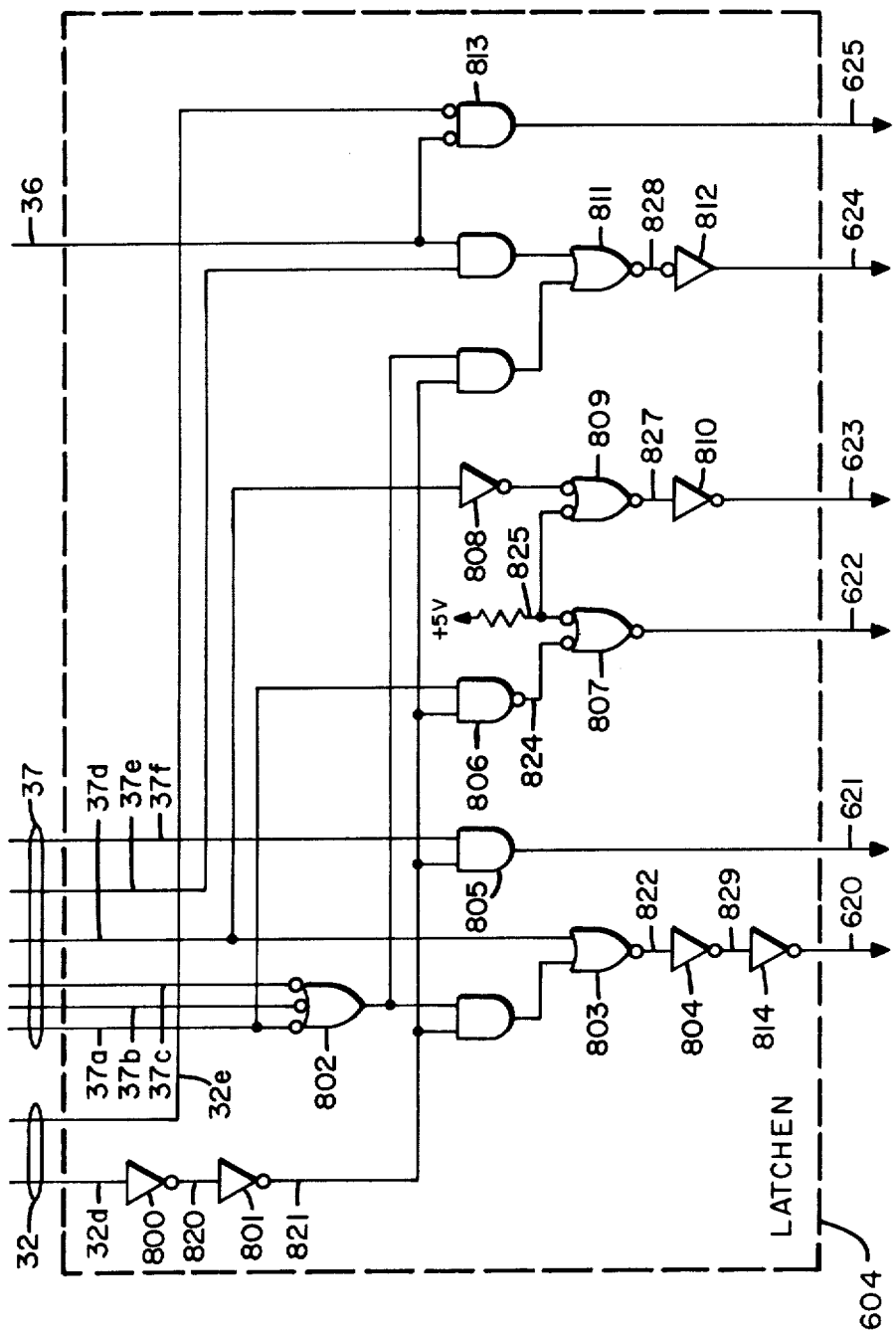
FIG. 9 provides an illustration of the LATCH/MUX 600 enable circuitry, LATCHEN 604.

FIG. 9 shows the circuitry of LATCHEN 604. The clear signal to the 64 data latches (i.e., low on line 620) is caused by a high on line 37d or a high on line 821 and a low on any of lines 37a, 37b or 37c as can be seen from FIG. 9. Lines 37a, 37b, 37c and 37d are outputs of TIMING AND CONTROL 28 which enable (are low) clearing of the 64 data latches for the normal read mode, write mode, burst read mode (i.e., function of MEMORY 11 not yet available) and enable write data respectively. If bit $2^{18}$ of SREG 21 (see also FIG. 4 and Table A) is set, line 821 is low and the normal clear enable signals on lines 37a, 37b and 37c cannot clear the 64 data latches. This is necessary to permit reading of the contents of LATCH/MUX 600 only (i.e., not altering contents of LATCH/MUX 600) whenever closed loop error (i.e., bit position $2^{18}$ of SREG 21) is set. Similarly, line 621 clears the eight error code data latches whenever it goes low. For a normal read, this occurs whenever timing signal on line 37f from TIM- ING AND CONTROL 28 goes high (i.e., during normal read). If closed loop error is set, however, line 821 is low and the eight error code latches cannot be cleared during a read access.

Line 622 when high latches all 72 bit positions of LATCH/MUX 600 for read data received from MEMORY ARRAY 22 during a read access. Notice that line 622 cannot become high (is always low) whenever closed loop error is set. This causes no data from MEMORY ARRAY 22 to be latched into LATCH/MUX 600. Line 623 latches write data received from MUX 101 into LATCH/MUX 600 in response to an enable write data (low) line 37d received from TIMING AND CONTROL 28.

Line 624 latches data from GOOD DATA LATCH 603 received via line 614 when it goes high. This normally occurs whenever closed loop error is clear and one of lines 37a (i.e., read mode), 37b (i.e., write mode), or 37c (i.e., burst read mode) are made low by TIMING AND CONTROL 28. When closed loop error is set, however, line 821 is low and none of the lines 37a, 37b and 37c can cause line 624 to become high. Line 624 can also become high, if SREG 21 is being accessed (i.e., line 36 is high as shown in FIG. 4) and line 37e becomes high. Line 37e is a timing signal generated by TIMING AND CONTROL 28 to disable latching the contents of GOOD DATA LATCH 603 into LATCH/MUX 600 during an access to SREG 21. Line 625 is provided to enable data from MUX 101 received via line 35 into the eight error code bit positions of LATCH/MUX 600. This permits CPU 10 to write test data directly into the eight error code bit positions for test purposes. Line 625 goes high (i.e., latches data from line 35) whenever bit position $2^{19}$ of SREG 21 is set (i.e., line 32e is low) and SREG 21 is not being accessed (i.e., line 36 is low).

Figure 10:
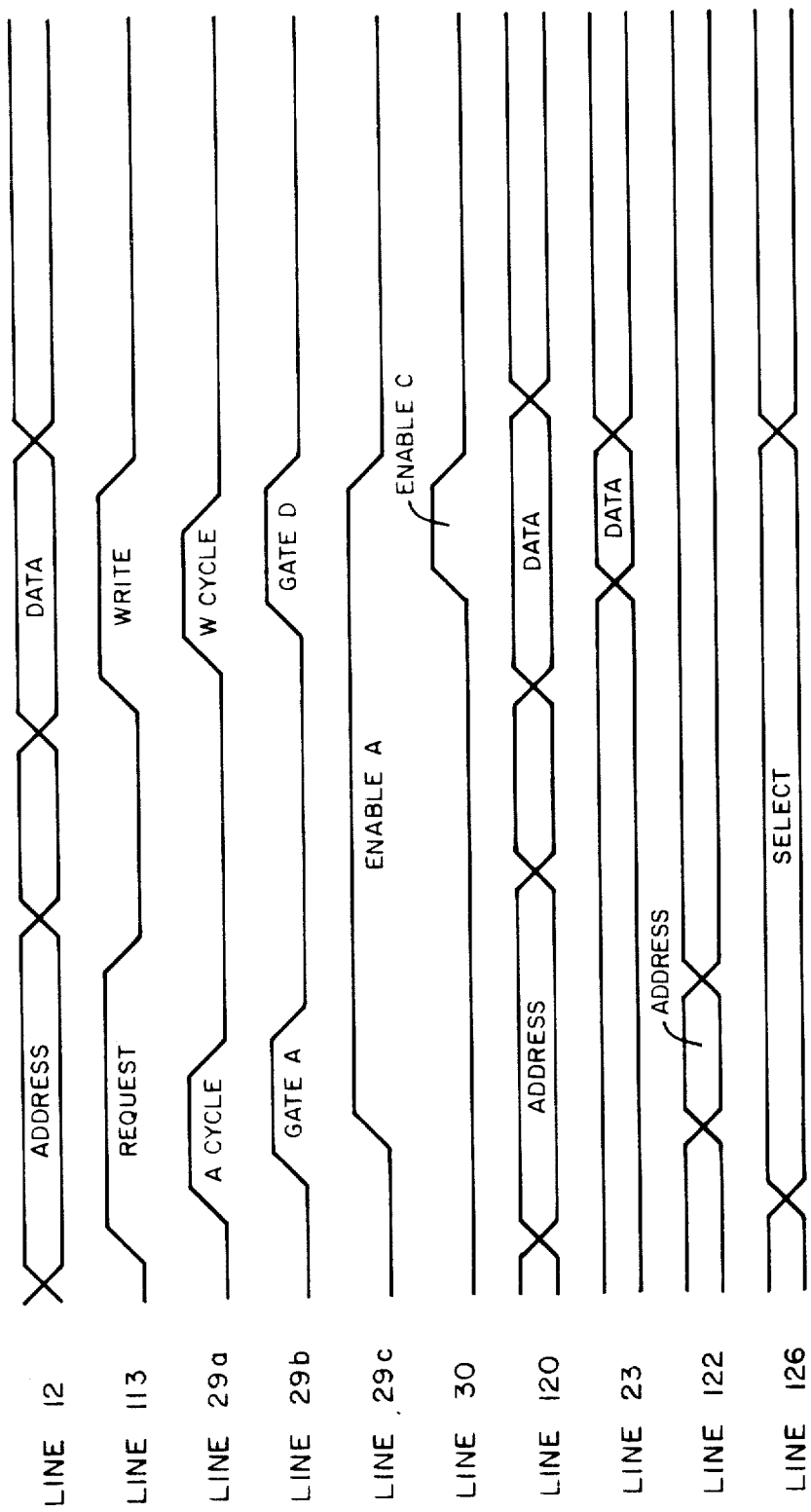
FIG. 10 shows the relative timing of a write access to status register, SREG 21.

FIG. 10 shows the relative timing of the key signals required to set one of the bit positions of SREG 21 (i.e., $2^{18}$ or $2^{19}$) to a binary one permitting closed loop error correct functions. Line 12 contains the data from CPU 10 transferred as an address word and an 8, 16 or 32 bit data word. Line 113 shows the presence of the access request and the write command. Line 29a indicates timing of the address word cycle, ACYCLE, and the data word cycle, WCYCLE; gating signals are supplied by TIMING AND CONTROL 28 to DMUX 102 via line 29b to gate the address word to AREG 104 (i.e., GATE A) and to gate the data word to SREG 21 (i.e., GATE D). TIMING AND CONTROL 28 transfers ENABLE A via line 29c to enable the address determination result (i.e., does AREG 104 contain X77777$_8$) to line 25. Lines 120, 121 and 122 conduct the address word and the data word. Priority 100 notifies MUX 101 of which of the possible eight interfaces to select via line 126.

Figure 11A:
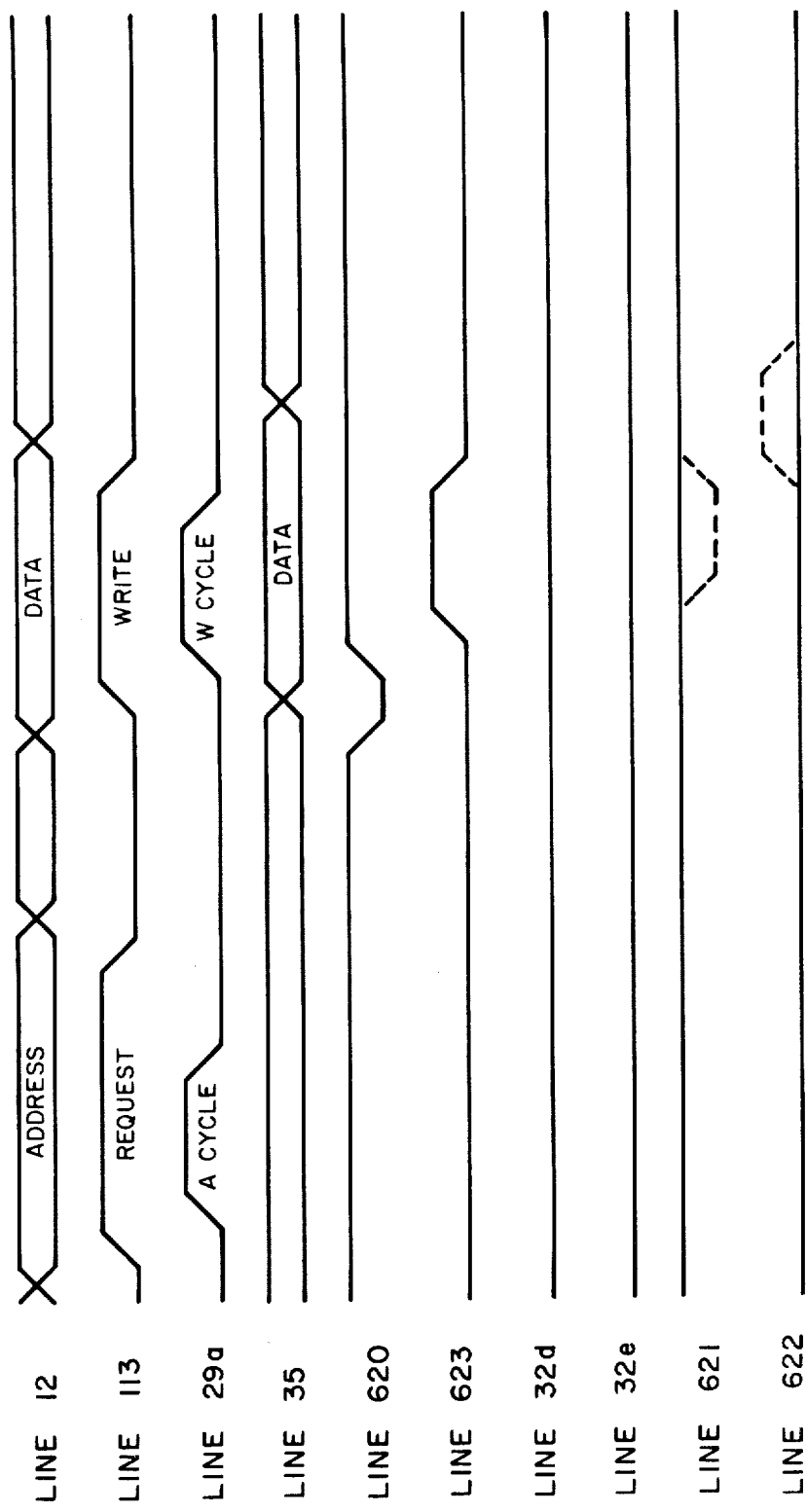
FIG. 11a shows the relative timing of a write access with closed loop error set.

FIG. 11a shows the relative timing of the key signals involved in a closed loop error correct write access modifying only the 64 data bit positions of LATCH/MUX 600 and leaving the write data in LATCH/MUX 600. The write access occurs as normal except that bits $2^{18}$ and $2^{19}$ of SREG 21 are set. This causes line 32d and line 32e to be low. Line 620 clears the 64 data bit positions of LATCH/MUX 600. Line 621 shows that the eight error code bit positions are not cleared. Line 622 shows that the 72-bit word from MEMORY ARRAY 22 is not enabled into LATCH/MUX 600. Line 623 shows that only the 32 bits received from MUX 101 via line 35 are enabled into LATCH/MUX 600.

Figure 11B:
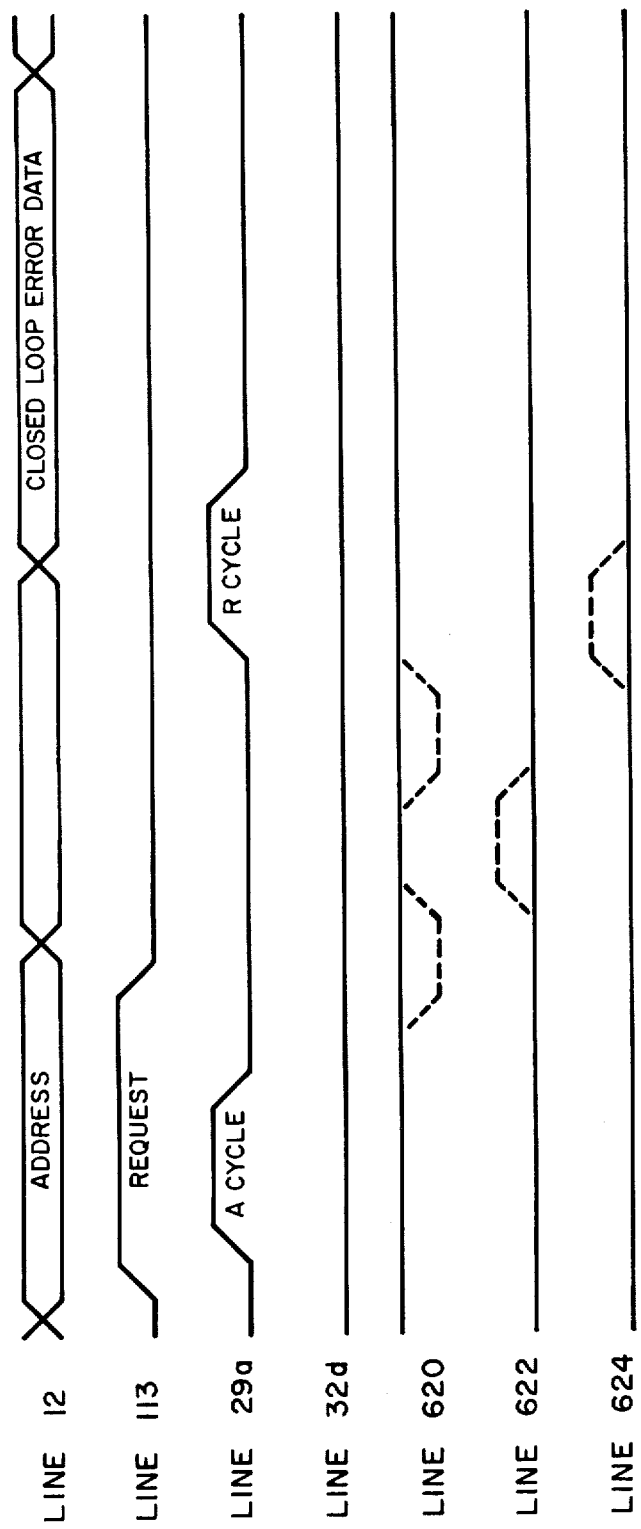
FIG. 11b shows the relative timing of a read access with closed loop error set.

FIG. 11b shows the relative timing of the key signals involved in a closed loop error read access which simply reads from the contents of LATCH/MUX 600 and does not transfer data from the addressable location of MEMORY ARRAY 22 which is addressed during the read access. Notice that closed loop error is set (i.e., line 32d low). Line 29a shows that an address cycle (ACYCLE) and read cycle (RCYCLE) are being initiated. Line 620, however, remains high (i.e., the 64 data bit positions of LATCH/MUX 600 are not cleared). Furthermore, line 622 shows no data being enabled into LATCH/MUX 600 received from MEMORY ARRAY 22 at either the 64 data bit positions or the eight error code bit positions. Line 634 shows that no data is enabled into LATCH/MUX 600 from GOOD DATA LATCH 603.

The disclosure above describes the preferred embodiment of the present invention which provides the closed loop error correct capability. Bit positions $2^{18}$ and $2^{19}$ of the status register, SREG 21, control the operation of this feature. If bit position $2^{18}$ is set, read and write accesses merely write into and read from LATCH/MUX 600. If bit position $2^{19}$ is set, direct access to the eight error code bit positions of LATCH/MUX 600 may be made. Using these novel capabilities, test software may be generated which can directly test for the proper operation of the error correction circuitry (ECC) without accessing MEMORY ARRAY 22.

What is claimed is:

1. In a computer having a memory module containing a memory array with a plurality of addressable locations into which data may be written and from which data may be read and containing an error correction circuit coupled to said memory array for generating error codes for data written into said memory array and correcting errors in data read from said memory array, and having a central processing unit responsively coupled to said memory module wherein said central processing unit is programmable through the execution of a series of software instructions, the apparatus for permitting said central processing unit to test said error correction circuit comprising:

means responsively coupled to said central processing unit for recording that said central processing unit is testing said error correction circuit; and means responsively coupled to said memory array, said error circuit, and said recording means for permitting said central processing unit to write into and read from said error correction circuit without writing into or reading from said memory array.

2. A computer according to claim 1 wherein said recording means further comprises:

a status register having contents alterable by said central processing unit through the execution of one of said series of software instructions.

3. A computer according to claim 2 wherein said permitting means further comprises:

a data register responsively coupled to said central processing unit, said error correction circuit, said memory array, and said status register from which data written into said memory array and is transferred to which data read from said memory array is transferred when said status register indicates that said central processing unit is not testing said error correction circuit, and from which data is not transferred to said memory array and to which data is not transferred from said memory array when said status register indicates that said central processing unit is testing said error correction circuitry.

4. In a computer having a memory module containing a memory array with a plurality of addressable locations into which data and error codes may be written and from which data and error codes may be read, and containing a first data register coupled to said memory array from which data written into said memory array is transferred and to which data read from said memory array is transferred, and containing an error correction circuit coupled to said first data register which generates error codes for data written into said memory array and corrects errors in data read from said memory array, and containing a second data register responsively coupled to said error correction circuit and said memory array from which error codes written into said memory array are transferred and to which error codes read from said memory array are transferred, and having a central processing unit programmable through the execution of a series of software instructions responsively coupled to said first data register permitting said central processing unit to write data into and read data from said memory array, the improvement comprising:

a manual switch whereby an operator can select a maintenance mode for said memory module;

a status register responsively coupled to said central processing unit and said manual switch into which said central processing unit may write data whenever said manual switch indicates said operator has selected said maintenance mode wherein said status register has a plurality of bit positions;

means responsively coupled to a first one of said plurality of bit positions of said status register, said first data register, said second data register, and said memory array for inhibiting the transfer of data from said memory array to said first data register and said second data register whenever said first one of said plurality of bit positions of said status register contains a predetermined value; and means responsively coupled to a second one of said plurality of bit positions of said status register and said second data register for permitting said central processing unit to directly write data into and directly read data from said second data register if and only if said second one of said plurality of bit positions of said status register contains a predetermined value.

* * * * *